US010446467B2

(12) United States Patent
Talpallikar

(10) Patent No.: US 10,446,467 B2
(45) Date of Patent: Oct. 15, 2019

(54) THERMAL TRANSFER/MANAGEMENT AND EMI SHIELDING/MITIGATION SOLUTIONS FOR ELECTRONIC DEVICES

(71) Applicant: Laird Technologies, Inc., Chesterfield, MO (US)

(72) Inventor: Sri Talpallikar, Deer Park, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 16/174,550

(22) Filed: Oct. 30, 2018

(65) Prior Publication Data

US 2019/0131206 A1 May 2, 2019

Related U.S. Application Data

(60) Provisional application No. 62/578,685, filed on Oct. 30, 2017.

(51) Int. Cl.
| | | |
|---|---|---|
| *H01L 23/053* | (2006.01) | |
| *H01L 23/367* | (2006.01) | |
| *H01L 23/552* | (2006.01) | |
| *H01L 21/48* | (2006.01) | |
| *H01L 23/373* | (2006.01) | |
| *H01L 23/00* | (2006.01) | |

(52) U.S. Cl.
CPC ...... *H01L 23/3675* (2013.01); *H01L 21/4882* (2013.01); *H01L 23/3736* (2013.01); *H01L 23/552* (2013.01); *H01L 24/32* (2013.01); *H01L 2224/32245* (2013.01); *H01L 2924/3025* (2013.01)

(58) Field of Classification Search
CPC ............ H01L 23/3675; H01L 23/3736; H01L 31/024; H01L 23/053
See application file for complete search history.

(56) References Cited

U.S. PATENT DOCUMENTS

| | | | |
|---|---|---|---|
| 9,330,998 B2 | 5/2016 | Strader et al. | |
| 2004/0074630 A1* | 4/2004 | Sen ........................ | H01L 23/433 165/46 |
| 2007/0089773 A1* | 4/2007 | Koester .................... | H01L 35/34 136/230 |
| 2009/0179323 A1* | 7/2009 | Feng .................... | H01L 23/3677 257/712 |
| 2010/0276799 A1* | 11/2010 | Heng ...................... | H01L 21/50 257/704 |
| 2014/0091461 A1* | 4/2014 | Shen ...................... | H01L 23/24 257/738 |
| 2017/0092619 A1* | 3/2017 | Refai-Ahmed ......... | H01L 24/00 |
| 2018/0090411 A1* | 3/2018 | Cetegen .............. | H01L 23/3736 |

FOREIGN PATENT DOCUMENTS

WO WO-2017087136 A1 5/2017

* cited by examiner

*Primary Examiner* — George R Fourson, III
(74) *Attorney, Agent, or Firm* — Harness, Dickey & Pierce, P.L.C.; Anthony G. Fussner

(57) ABSTRACT

Disclosed are exemplary embodiments of thermal transfer/management and electromagnetic interference (EMI) shielding/mitigation solutions, systems, and/or assemblies for electronic devices. Also disclosed are methods of making or manufacturing (e.g., stamping, drawing, etc.) components of the thermal transfer/management and EMI shielding/mitigation solutions, systems, and/or assemblies.

20 Claims, 4 Drawing Sheets

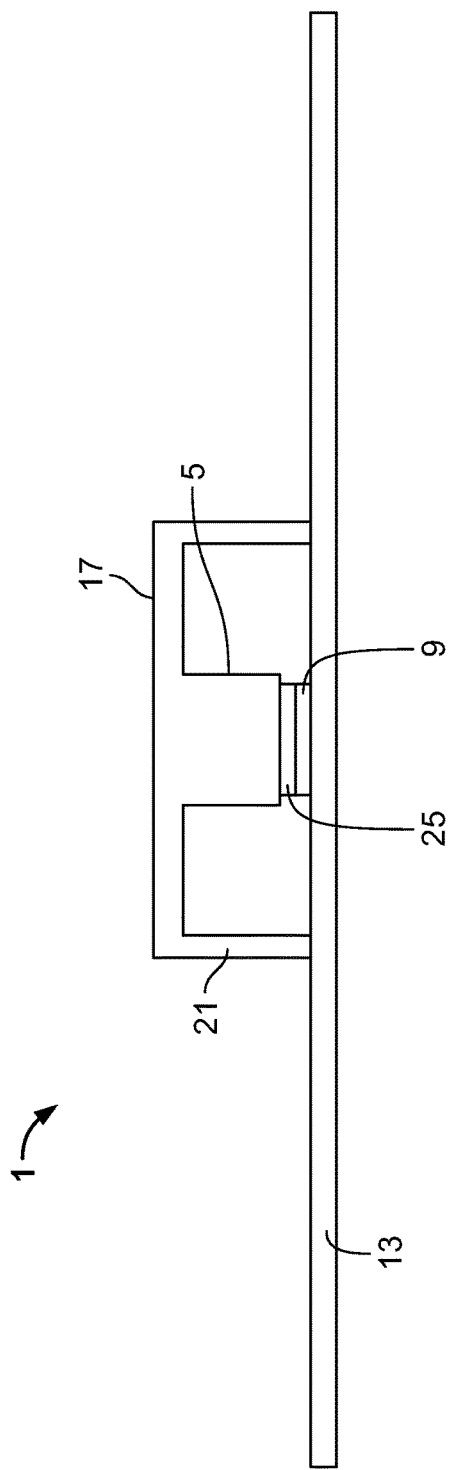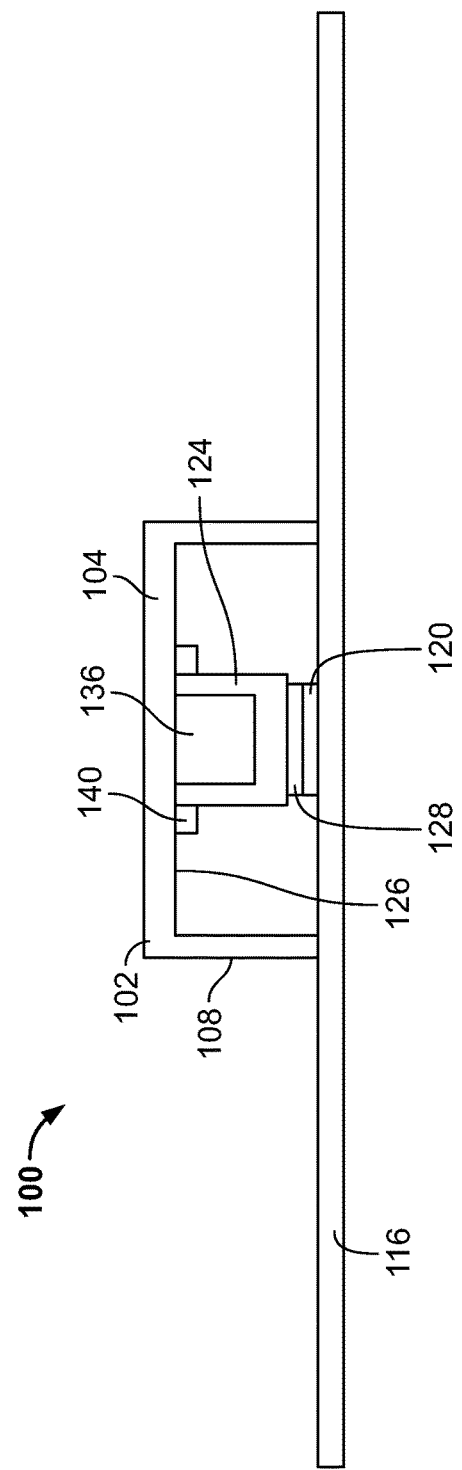

THERMAL TRANSFER/MANAGEMENT AND EMI SHIELDING/MITIGATION SOLUTIONS FOR ELECTRONIC DEVICES

CROSS-REFERENCE TO RELATED APPLICATION

This application claims the benefit of and priority U.S. Provisional Application Ser. No. 62/578,685 filed Oct. 30, 2017. The entire disclosure of the above application is incorporated herein by reference.

FIELD

The present disclosure relates to thermal transfer/management and electromagnetic interference (EMI) shielding/mitigation solutions, systems, and/or assemblies for electronic devices. Also disclosed are methods of making or manufacturing (e.g., stamping, drawing, etc.) components of the thermal transfer/management and EMI shielding/mitigation solutions, systems, and/or assemblies.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIG. 1 illustrates a conventional die cast aluminum housing including a pedestal extending downwardly towards an integrated circuit (IC) on a printed circuit board (PCB).

FIG. 2 illustrates an exemplary embodiment of a housing or case including a pedestal or contact coupled to and/or extending downwardly from an inner surface of the housing or case.

DETAILED DESCRIPTION

Figure 3:
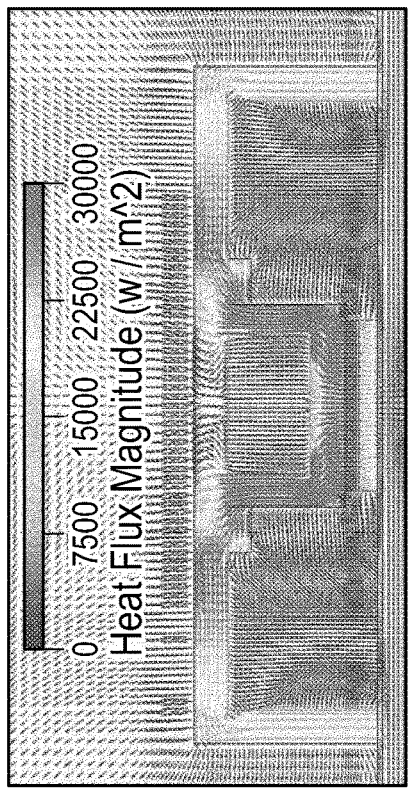
FIGS. 3 and 4 are heat flux and temperature contour plots, respectively, from a simulation using a model of a conventional aluminum die cast housing as shown in FIG. 1.

Example embodiments will now be described more fully with reference to the accompanying drawings.

Traditionally, die cast housings have been used in various electronic housing/cover applications in automotive, graphic engines, etc. Due to the requirement of dissipation of heat generated by the high-powered IC in such applications, a conventional die cast housing typically includes an integral pedestal that extends downwardly towards and come close to the top of the IC. The pedestal is an integral part of the die cast housing such that the pedestal is die cast from the same piece of material as the housing. A thermal interface material (TIM) may be placed in-between the bottom of the pedestal and the IC to aid in heat transfer from the IC to the pedestal that is integral to die cast housing.

For example, FIG. 1 illustrates a conventional die cast aluminum housing or case 1 including a pedestal 5. The die cast housing 1 is shown positioned over an integrated circuit (IC) 9 on a printed circuit board (PCB) 13 such that the pedestal 5 extends downwardly the towards the IC 9 on the PCB 13. A thermal interface material (TIM) 25 is along the bottom of the pedestal 5. The TIM 25 is in thermal contact with the top of the IC 9 for establishing a thermally-conductive pathway from the IC 9 to the pedestal 5. The pedestal 5 is an integral part of the die cast housing 1 such that the housing 1 and the pedestal 5 have a single piece, monolithic construction. The pedestal 5 is die cast from the same piece of material used to make the top 17 and sidewalls 21 of the housing 1. The die casting process for making the housing 1, however, tends to be costly, imprecise, require a long lead time, and have limited design freedom.

Disclosed herein are exemplary embodiments of thermal transfer/management and electromagnetic interference (EMI) shielding/mitigation solutions, systems, and/or assemblies that include stamped and/or drawn components (e.g., board level shields, housings, cases, covers, combinations thereof, etc.). Also disclosed are methods of making or manufacturing (e.g., stamping, drawing, etc.) components of the thermal transfer/management and EMI shielding/mitigation solutions, systems, and/or assemblies. In exemplary embodiments, an integrated or combined EMI shielding/thermal transfer system may be used to improve heat transfer from an integrated circuit (IC) (or other heat source) on a printed circuit board (or other substrate) to a heat sink (or other heat removal/dissipation structure).

Exemplary embodiments may include or provide one or more (but not necessarily any or all) of the following features or advantages, such as improving or providing similar overall thermal performance as compared to conventional die cast aluminum housings for integrated circuits without compromising on EMI shielding. Exemplary embodiments may include one or more stamped components or parts (e.g., one or more stamped or embossed pedestals, contacts, etc.) that are formed via stamping instead of die casting, which stamping process may advantageously allow for reduced costs, more precision, reduced lead time, and/or increased design freedom, etc.

FIG. 2 illustrates an exemplary embodiment of an integrated or combined thermal transfer/management and EMI shielding/mitigation solution, system, or assembly 100 embodying one or more aspects of the present disclosure. In this exemplary embodiment, the EMI shielding/thermal transfer assembly 100 includes an EMI shield 102 (e.g., a one-piece or multi-piece board level shield (BLS), housing, cover, case, other component or part, etc.). By way of example, the EMI shield 102 may comprise an electronic module housing and/or cover configured for use as an EMI enclosure (Faraday Cage) and/or for protecting electronics of the module from environmental effects, such as dust, rain, weather, etc.

As shown in FIG. 2, the EMI shield 102 includes a cover, lid, top, or upper surface 104 and one or more sidewalls 108. In this example, the cover 104 and the sidewalls 108 have a one-piece, monolithic construction. For example, the cover 104 and the sidewalls 108 may be integrally formed from the same piece of material via stamping and/or drawing processes. Alternatively, the sidewalls 108 may be made separately and not integrally formed with the cover 104. In exemplary embodiments, the cover 104 is not removable from and is not reattachable to the sidewalls 108. In other exemplary embodiments, the EMI shield 102 may comprise a two-piece or multi-piece BLS in which the cover 104 is removable from and reattachable (e.g., via locking dimples or detents, etc.) to the sidewalls 108, which, in turn, may define or be part of a frame or fence of the BLS. In this latter example, the frame or fence may include a removable pickup bridge and may be configured with a relatively narrow width to facilitate optical inspection of components underneath the BLS.

The sidewalls 108 may be configured for installation (e.g., soldering, etc.) to a printed circuit board (PCB) 116 (broadly, a substrate) generally about one or more components or heat sources 120 (e.g., an integrated circuit (IC), etc.) on the PCB 116. In this exemplary embodiment, the heat source 120 may comprise a high-powered IC in an automotive application, graphics engine application, etc. Alternatively, the integrated or combined EMI shielding/thermal transfer assembly 100 may be used with other heat sources and/or in other applications, etc.

With continued reference to FIG. 2, the assembly 100 includes one or more pedestals or contacts 124 (broadly, a part or portion) extending downwardly relatively to and/or from an inner surface 126 of the cover 104 of the EMI shield 102. In this example, a hollow interior space or cavity 136 is defined by the pedestal 124 between the inner surface of the pedestal 124 and the inner surface 126 of the EMI shield 102. The interior space or cavity 136 may be filled with air. In other exemplary embodiments, the interior space or cavity 136 may be partially or entirely filled with another material (e.g., a thermal interface material, etc.) having a thermal conductivity greater than air.

Alternative embodiments may include more than one pedestal and/or one or more pedestals having a different configuration. For example, another exemplary embodiment may include one or more pedestals having resilient and/or spring fingers (e.g., fingers 230 shown in FIG. 11, etc.) that are configured to create a positive spring force when a TIM along the bottom of the pedestal is compressed against the top of the heat source. The positive spring force may help provide and/or ensure good thermal contact between the TIM and the heat source and between the TIM and the pedestal.

In this exemplary embodiment, the pedestal 124 is a separate component (e.g., stamped, embossed, etc.) that is attached to the inner surface 126 by laser welds 140. Alternatively, other embodiments may include one or more pedestals formed via other methods besides stamping (e.g., drawing, extruding, machining, etc.) and/or one or more pedestals coupled to the inner surface using other attachment methods besides laser welding (e.g., spot welding, thermally-conductive adhesives, welding, etc.). In yet other exemplary embodiments, at least one pedestal may be integrally formed (e.g., deep drawn, extruded, machined, etc.) with the EMI shield, housing, or case such that the pedestal does not need to be separately attached via laser welding or other methods.

By way of example, the EMI shield, housing, or case 102 and the at least one pedestal 124 may have a single piece, monolithic construction in which the EMI shield, housing, or case and at least one pedestal are drawn from the same piece of material (e.g., aluminum, other electrically-conductive material, etc.) such that there are no pedestals welded to the drawn EMI shield, housing, or case. Or, for example, the EMI shield, housing, or case and the at least one pedestal may have a single piece, monolithic construction in which the EMI shield, housing, or case and at least one pedestal are stamped and formed (e.g., folded, bent, etc.) from the same piece of material (e.g., aluminum, other electrically-conductive material, etc.) such that there are no pedestals welded to the stamped EMI shield, housing, or case. Instead, the pedestal(s) may be embossed pedestal(s) formed via a stamping process.

The pedestal 124 may be made from a material(s) that is the same as or different than the material(s) used to make the EMI shield 102, such a beryllium copper, cold rolled steel, aluminum, aluminum alloy (e.g., aluminum alloy A360, aluminum alloy 1050, etc.), copper, stainless steel, other metals, other alloys, other electrically-conductive materials preferably having relatively high thermal conductivity and/ or relatively low costs, combinations thereof, etc. In an exemplary embodiment, the pedestal 124 and the EMI shield 102 are made of aluminum alloy 1050. In another exemplary embodiment, the pedestal 124 is made of aluminum alloy 1050, and the EMI shield 102 is made of aluminum alloy A360. In a further exemplary embodiment, the pedestal 124 is made of beryllium copper, and the EMI shield 102 is made of aluminum alloy 1050. In an additional exemplary embodiment, the pedestal 124 is made of copper, and the EMI shield 102 is made of aluminum alloy 1050. Alternatively, other suitable materials may be used for the pedestal 124 and/or EMI shield 102 in other exemplary embodiments.

A thermal interface material (TIM) 128 is disposed (e.g., dispensed via a nozzle, etc.) along the bottom of the pedestal 124. The pedestal 124 and TIM 128 may be configured (e.g., sized, shaped, located, etc.) to thermally contact a top of the heat source 120 for establishing a thermally-conductive pathway from the heat source 120 to the pedestal 124. Example thermal interface materials that may be used in exemplary embodiments include dispensable thermal interface materials, thermal putties, thermal gap fillers, thermal phase change materials, thermally-conductive EMI absorbers or hybrid thermal/EMI absorbers, thermal pads, thermal greases, thermal pastes, etc.

As shown in FIG. 2, the EMI shield 102 may be installed to the PCB 116 such that the heat source 120 is underneath the EMI shield 102 within an interior cooperatively defined by the sidewalls 108, cover 104, and PCB 116. The pedestal 124 extends downwardly towards the heat source 120 such that the TIM 128 is in thermal contact (e.g., compressed against, etc.) with both the heat source 120 and the pedestal 124. Heat may thus be transferred from the heat source 120 to the pedestal 124 via the thermally-conductive heat path or pathway defined by and through the TIM 128. Heat may thus be transferred from the heat source 120 through the TIM 128 and the pedestal 124 to the EMI shield 102. From the EMI shield 102, heat may be transferred or dissipated to the environment or to a heat sink, heat spreader, or other heat removal/dissipation structure.

Figure 4:
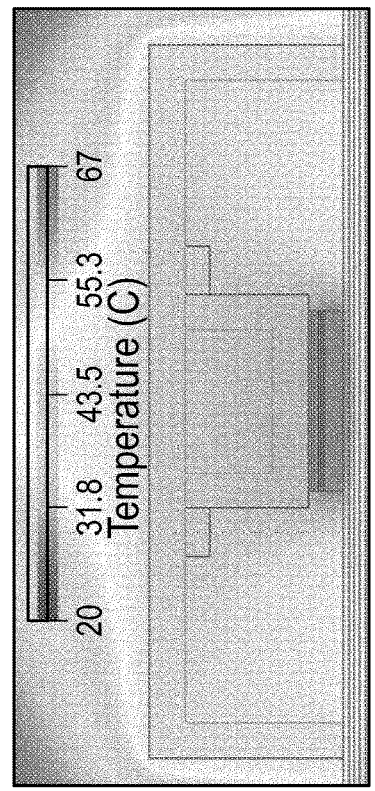

FIGS. 3 and 4 are heat flux and temperature contour plots, respectively, from a simulation using a model of a conventional aluminum die cast housing 1 and aluminum pedestal 5 as shown in FIG. 1 and the model assumptions and dimensions set forth in Table 1 below. The maximum IC temperature was 66.7 degrees Celsius when the die cast aluminum housing 1 and pedestal 5 had a thermal conductivity of 113 W/mK (aluminum alloy A360), and the thermal interface material (TIM) 25 had a thermal conductivity of 5 W/mK.

Figure 5:
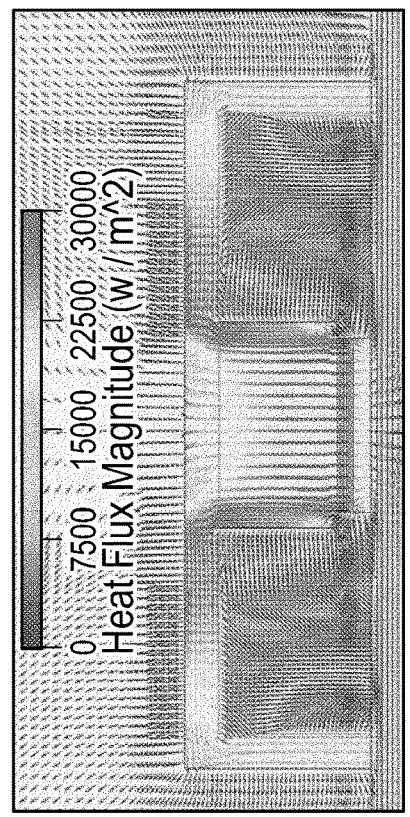
FIGS. 5 and 6 are heat flux and temperature contour plots, respectively, from a simulation using a model of a stamped aluminum housing with a stamped aluminum pedestal as shown in FIG. 2.
Figure 6:
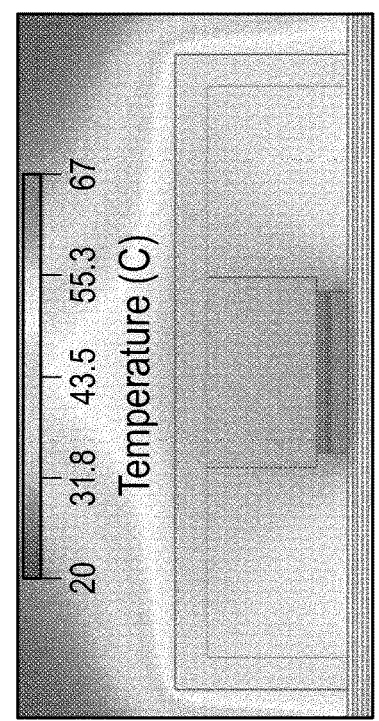

FIGS. 5 and 6 are heat flux and temperature contour plots, respectively, from a simulation using a model of a stamped aluminum housing 102 with a stamped aluminum pedestal 124 as shown in FIG. 2 and the model assumptions and dimensions set forth in Table 1 below. Air was within the hollow interior space or cavity 136 defined by the pedestal 124 between the inner surface of the pedestal and the inner top surface of the housing or case 102. For a first simulation, the maximum IC temperature was 65.5 degrees Celsius when the stamped housing and stamped pedestal each had a thermal conductivity of 222 W/mK (aluminum alloy 1050). For a second simulation, the maximum IC temperature was 66.5 degrees Celsius when the stamped housing had a thermal conductivity of 113 W/mK (aluminum alloy A360) and the stamped pedestal had a thermal conductivity of 222 W/mK (aluminum alloy 1050). For both simulations, the thermal interface material (TIM) had a thermal conductivity of 5 W/mK.

Table 1 below includes the model assumptions (Model Assumptions: Power=3 Watts, Natural convention, $T_{amb}$=20° C.) and example dimensions (length X, width Y, and height Z) in millimeters (mm) for the integrated circuit (IC), thermal interface material (TIM), printed circuit board (PCB), case, and pedestal. These model assumptions and example dimensions were used during the thermal modeling simulations to determine maximum IC temperatures and create the heat flux and temperature contour plots shown in FIGS. 3, 4, 5, and 6. The results generally indicate that the thermal performance of the stamped aluminum housing 102 with a stamped aluminum pedestal 124 (FIG. 2) is similar or comparable to the thermal performance of the conventional die cast housing 1 and pedestal 5 (FIG. 1).

TABLE 1

| Component | Dimensions (x, y, z) in Millimeters (mm) |
|---|---|
| IC | 7.6 mm × 7.6 mm × 0.8 mm |
| TIM | 7.6 mm × 7.6 mm × 0.65 mm |
| PCB | 100 mm × 100 mm × 1.2 mm |
| Aluminum Case | 30 mm × 30 mm × 8.1 mm, wall thickness = 1.5 mm |
| Aluminum Pedestal/ Stamped Part | 9 mm × 9 mm × 5.15 mm, wall thickness = 1.5 mm |
| Air Filled Pocket or Cavity | 6 mm × 6 mm × 3.65 mm |

Model Assumptions: Power = 3 Watts, Natural convention, $T_{amb}$ = 20° C.

The dimensions and assumptions in Table 1 above are provided only for purposes of illustration and not for purposes of limitation as other exemplary embodiments may be configured with different dimensions. Likewise, the contour plots, simulation results, and materials are provided only for purposes of illustration and not for purposes of limitation as other exemplary embodiments may be configured differently, e.g., made from different materials with higher or lower thermal conductivities, provide a higher or lower maximum IC temperature, etc.

Table 2 below includes additional thermal simulation results for the model of the stamped housing and stamped pedestal (FIG. 2) and for the model of the die cast housing and pedestal (FIG. 1). For these additional thermal simulations, the model assumptions and dimensions in Table 1 above were used again used except that the wall thickness was reduced from 1.5 mm to 0.8 mm and the stamped pedestal thickness (FIG. 2) was reduced from 1.5 mm to 0.15 mm.

As show in Table 2, the maximum IC temperature was 76.7 degrees Celsius when the stamped housing/case and the stamped pedestal each had a thermal conductivity of 222 W/mK (aluminum alloy 1050). The maximum IC temperature was 81.7 degrees Celsius when the stamped housing/ case had a thermal conductivity of 222 W/mK (aluminum alloy 1050) and the stamped pedestal had a thermal conductivity of 130 W/mK (beryllium copper). The maximum IC temperature was 73.1 degrees Celsius when the stamped housing/case had a thermal conductivity of 222 W/mK (aluminum alloy 1050) and the stamped pedestal had a thermal conductivity of 386 W/mK (copper). The maximum IC temperature was 70.4 degrees Celsius when the die cast housing/case and pedestal had a thermal conductivity of 113 W/mK (aluminum alloy A360). These model assumptions and example dimensions were used during the thermal modeling simulations to determine the maximum IC temperatures shown in Table 2 below and create the heat flux and temperature contour plots shown in FIGS. 7 through 10. For the simulations, the thermal interface material (TIM) had a thermal conductivity of 5 W/mK.

TABLE 2

| Manufacturing Method | Case Material | Pedestal/ Stamped Part Material | Temperature (° C.) |
| --- | --- | --- | --- |
| Stamped | Al 1050 (222 W/mK) | Al 1050 (222 W/mK) | 76.7 |
| Stamped | Al 1050 (222 W/mK) | BeCu (130 W/mK) | 81.7 |
| Stamped | Al 1050 (222 W/mK) | Cu (386 W/mK) | 73.1 |
| Die Cast | Al 360 (113 W/mK) | Al 360 (113 W/mK) | 70.4 |

Figure 7:
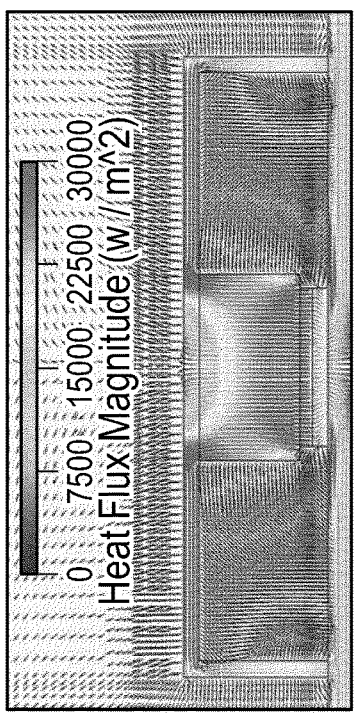
FIGS. 7 and 8 are heat flux and temperature contour plots, respectively, from a simulation using a model of a conventional aluminum die cast housing as shown in FIG. 1.
Figure 8:

FIGS. 7 and 8 are heat flux and temperature contour plots, respectively, for the model of the conventional housing and pedestal shown in FIG. 1 with the model assumptions and dimensions disclosed herein and shown in Tables 1 and 2.

Figure 9:
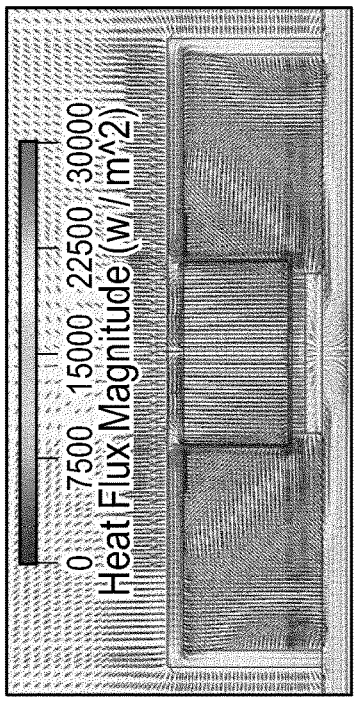
FIGS. 9 and 10 are heat flux and temperature contour plots, respectively, from a simulation using a different model of a stamped aluminum housing with a stamped aluminum pedestal as shown in FIG. 2.
Figure 10:

FIGS. 9 and 10 are heat flux and temperature contour plots, respectively, for the model of the stamped housing and stamped pedestal shown in FIG. 2. The stamped housing and stamped pedestal each had a thermal conductivity of 222 W/mK (aluminum alloy 1050) and with the model assumptions and dimensions in Table 1 above. The results indicate that as the stamped pedestal gets thinner, the disadvantage of insulation caused by the air trapped in the stamped pedestal becomes dominant over the advantage of higher thermal conductivity. The dimensions, assumptions, materials, and results are provided herein only for purposes of illustration and not for purposes of limitation as other exemplary embodiments may be configured differently, such as with different dimensions, made from different materials, and/or with different performance, etc.

Figure 11:
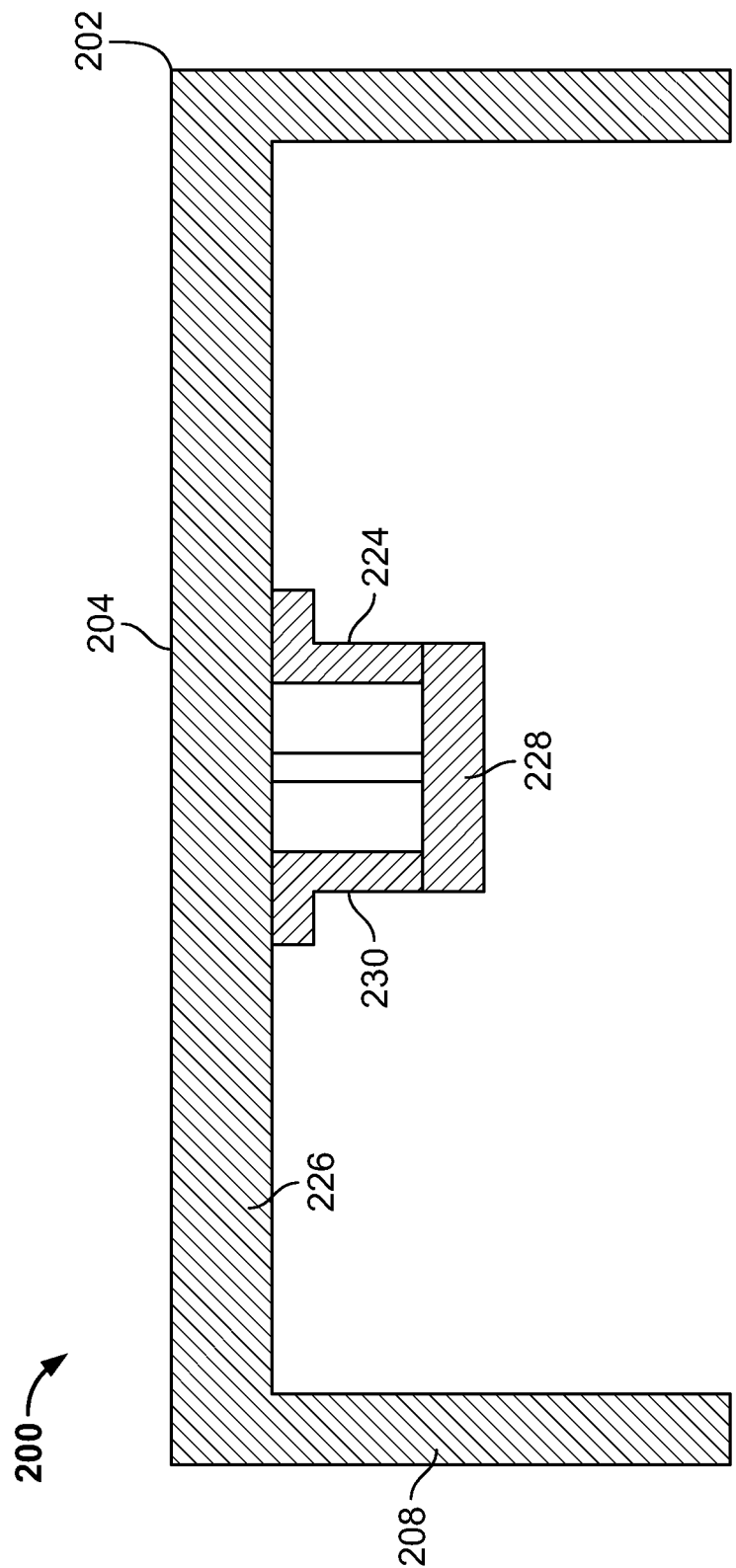
FIG. 11 illustrates an exemplary embodiment of a housing or case including a pedestal or contact a coupled to and/or extending downwardly from an inner surface of the housing or case.

FIG. 11 illustrates an exemplary embodiment of an integrated or combined thermal transfer/management and EMI shielding/mitigation solution, system, or assembly 200 embodying one or more aspects of the present disclosure. In this exemplary embodiment, the EMI shielding/thermal transfer assembly 200 includes an EMI shield 202 (e.g., a one-piece or multi-piece board level shield (BLS), housing, cover, case, other component or part, etc.).

The EMI shield 202 includes a cover, lid, top, or upper surface 204 and one or more sidewalls 208. A pedestal or contact 224 (broadly, a part or portion) extends downwardly relatively to and/or from an inner surface 226 of the cover 204 of the EMI shield 202.

In this example, the pedestal or contact 224 includes a plurality of resilient spring fingers 230 configured to create a positive spring force when the thermal interface material 228 along the bottom of the pedestal 224 contacts and is compressed against a heat source. The positive spring force may help provide and/or ensure good thermal contact between the TIM 228 and the heat source and between the TIM 228 and the pedestal 224.

The pedestal 224 may be made from a material(s) that is the same as or different than the material(s) used to make the EMI shield 202. Preferably, the pedestal's fingers 230 are made of a resilient materials, such a beryllium copper, etc.

Example thermal interface materials that may be used in exemplary embodiments include extrudable thermal interface materials, insert moldable thermal interface materials, dispensable thermal interface materials, thermal putties, thermal gap fillers, thermal phase change materials, thermally-conductive EMI absorbers or hybrid thermal/EMI absorbers, thermal pads, thermal greases, thermal pastes, etc.

Example embodiments may include one or more thermal interface materials of Laird, such as any one or more of the Tputty™ series thermal gap fillers (e.g., Tputty™ 403, 504, 506, 508, or 607 dispensable thermal interface materials, etc.), Tflex™ series gap fillers (e.g., Tflex™ 300 series thermal gap filler materials, Tflex™ 600 series thermal gap filler materials, Tflex™ 700 series thermal gap filler materials, etc.), Tflex™ CR200 two-part cure in place gap filler, Tpcm™ series thermal phase change materials (e.g., Tpcm™ 780 series phase change materials, etc.), Tpli™ series gap fillers (e.g., Tpli™ 200 series gap fillers, etc.), Tgard™ series thermally-conductive electrical insulator materials and pads (e.g., Tgard™ 20, 100, 200, 300, 400, 500, 3000, 5000, TNC-5, K52, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), Tmate™ 2900 series reusable phase change materials, Tgrease™ 300X silicone-based thermal grease, Tgrease™ 2500 silicone-free thermal grease, Tgon™ 800 series thermal interface materials or graphite sheets, Tgon™ 9000 series graphite sheets (e.g., Tgon™ 9017, 9025, 9040, 9070, 9100, etc.), Tgon™ encapsulate or potting compounds, such as Tgon™ 455-18SH, etc.

In some exemplary embodiments, a dispensable thermal interface material may be dispensed along a bottom of a pedestal or contact. By way of example, a dispensable thermal interface material of Laird may be used, such as one or more of Tflex™ CR200, Tputty™ 403, Tputty™ 504, and/or Tputty™ 506 dispensable thermal gap fillers. For example, the thermal interface material may comprise a two-part cure in place ceramic filled silicone-based thermal gap filler that is curable at room temperature, has a low viscosity (e.g., 260,000 cps before mixing, etc.), good thermal conductivity (e.g., about 2 W/mK, etc.), and that is soft and compliant (e.g., hardness (Shore 00) 3 second of 45, etc.). As another example, the thermal interface material may comprise a single-part silicone-based thermal gap filler that is soft, compliant, and low abrasion and that has good thermal conductivity (e.g., about 2.3 W/mK, etc.). As a further example, the thermal interface material may comprise a soft silicone-based thermal gap filler that is a ceramic-filled dispensable silicone gel, that is soft and compliant, that has good thermal conductivity (e.g., about 1.8 W/mK, etc.), that can be applied like grease, and that is easily dispensable from equipment such as screen print, syringe, and automated equipment. As yet a further example, the thermal interface material may comprise a soft single-part silicone putty thermal gap filler in which no cure is required, that has good thermal conductivity (e.g., about 3.5 W/mK, etc.), and that is soft, compliant, non-abrasive, and dispensable.

In some exemplary embodiments, the thermal interface material may comprise a compliant gap filler having high thermal conductivity and/or may comprise a thermal interface material of Laird, such as one or more of Tflex™ 200, Tflex™ HR200, Tflex™ 300, Tflex™ 300 TG, Tflex™ HR400, Tflex™ 500, Tflex™ 600, Tflex™ HR600, Tflex™ SF600, Tflex™ 700, Tflex™ SF800 thermal gap fillers. For example, the thermal interface material may comprise a filled (e.g., alumina, ceramic, boron nitride, etc.) silicone elastomer gap filler that is soft, compliant, free-standing, and/or naturally tacky for adhesion during assembly and transport, and has good thermal conductivity (e.g., about 1.1 W/mK, 1.2 W/mK, 1.6 W/mK, 2.8, W/mK, 3 W/mK, 5 W/mK, etc.). As another example, the thermal interface material may comprise a filled silicone elastomer gel that has good thermal conductivity (e.g., about 1.2 W/mK, 1.8 W/mK, etc.) and that may also include a silicone liner or other dielectric barrier. As a further example, the thermal interface material may comprise a ceramic-filled silicone-free gap filler that has good thermal conductivity (e.g., about 7.8 W/mK, etc.) and a flammability rating of UL94 V0 and/or is naturally tacky.

The cover and sidewalls of the EMI shield (e.g., a one-piece or multi-piece board level shield (BLS), housing, cover, case, other component or part, etc.) and the pedestal or contact may be made from a wide range of materials in exemplary embodiments. By way of example, a non-exhaustive list of exemplary materials from which an EMI shield, pedestal, or portion thereof may be made include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

In exemplary embodiments, the sidewalls and cover of the EMI shield may be formed by stamping the same electrically-conductive piece of material and then folding the stamped material such that the sidewalls are generally perpendicular to the cover. Alternatively, the sidewalls may be made separately and not integrally formed with the cover. In some exemplary embodiments, the EMI shield may comprise a two-piece shield in which the upper surface, cover, lid, or top is removable from and reattachable to the sidewalls. In some exemplary embodiments, the EMI shield may include one or more interior walls, dividers, or partitions that are attached to and/or integrally formed with the EMI shield. In such exemplary embodiments, the cover, sidewalls, and interior walls may cooperatively define a plurality of individual EMI shielding compartments. Accordingly, aspects of the present disclosure should not be limited to only a single EMI shield configuration.

Exemplary embodiments disclosed herein may be used as an electronics housing, case, or cover for an integrated circuit (IC), such as a high-powered IC used in an automotive application, graphics engine application, etc. But example embodiments disclosed herein may also be used in a wide range of other applications and/or with a wide range of heat sources, electronic devices, and/or heat removal/dissipation structures or components (e.g., a heat spreader, a heat sink, a heat pipe, a device exterior case or housing, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 18, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal management and electromagnetic interference mitigation assembly comprising:
   a housing having an inner surface;
   a pedestal mechanically coupled to and extending downwardly relative to the inner surface of the housing; and
   a thermal interface material along a bottom of the pedestal;
   wherein:
   the thermal management and electromagnetic interference mitigation assembly further comprises one or more laser welds mechanically coupling the pedestal to the inner surface of the housing; and/or
   the pedestal includes one or more resilient spring fingers.

2. The thermal management and electromagnetic interference mitigation assembly of claim 1, wherein the housing is configured to be positioned over a heat source such that the pedestal extends downwardly from the inner surface of the housing towards the heat source, whereby the thermal interface material along the bottom of the pedestal is positionable in thermal contact with the heat source to thereby establish a thermally-conductive pathway from the heat source to the pedestal.

3. The thermal management and electromagnetic interference mitigation assembly of claim 1, wherein the housing is configured to be positioned over a heat source such that the pedestal extends downwardly from the inner surface of the housing towards the heat source whereby the thermal interface material is compressible between the heat source and the pedestal to thereby establish a thermally-conductive pathway from the heat source to the pedestal.

4. A thermal management and electromagnetic interference mitigation assembly comprising:
   a housing having an inner surface;
   a pedestal mechanically coupled to and extending downwardly relative to the inner surface of the housing;
   a thermal interface material along a bottom of the pedestal; and
   one or more laser welds mechanically coupling the pedestal to the inner surface of the housing.

5. The thermal management and electromagnetic interference mitigation assembly of claim 1, wherein the pedestal includes an inner surface that cooperates with the inner surface of the housing to cooperatively define an interior space between the inner surface of the pedestal and the inner surface of the housing.

6. The thermal management and electromagnetic interference mitigation assembly of claim 5, further comprising a thermally-conductive material within the interior space that has a thermal conductivity greater than air.

7. A thermal management and electromagnetic interference mitigation assembly comprising:
   a housing having an inner surface;
   a pedestal mechanically coupled to and extending downwardly relative to the inner surface of the housing; and
   a thermal interface material along a bottom of the pedestal;
   wherein the pedestal includes one or more resilient spring fingers.

8. The thermal management and electromagnetic interference mitigation assembly of claim 7, wherein the one or more resilient spring fingers are configured to create a positive spring force to help compress the thermal interface material between the pedestal and a heat source when the thermal interface material is positioned against a portion of the heat source.

9. The thermal management and electromagnetic interference mitigation assembly of claim 1, wherein:
the housing comprises stamped metal or drawn metal; and
the pedestal comprises stamped metal or drawn metal.

10. The thermal management and electromagnetic interference mitigation assembly of claim 1, wherein:
the housing comprises a stamped aluminum housing; and
the pedestal comprises a stamped aluminum pedestal.

11. The thermal management and electromagnetic interference mitigation assembly of claim 1, wherein the housing and the pedestal have a single piece, monolithic construction in which the housing and the pedestal are drawn from or stamped and then formed from a same piece of material.

12. A thermal management and electromagnetic interference mitigation assembly comprising:
a housing having an inner surface;
a pedestal mechanically coupled to and extending downwardly relative to the inner surface of the housing; and
a thermal interface material along a bottom of the pedestal;
wherein the thermal interface material comprises an extrudable thermal interface material, an insert moldable thermal interface material, a dispensable thermal interface material, a thermal putty, a thermal gap filler, a thermal phase change material, a thermally-conductive electromagnetic interference absorber, a hybrid thermal/electromagnetic interference absorber, a thermal pad, a thermal grease, or a thermal paste; and/or wherein:
the housing and the pedestal are made from an aluminum alloy; or
the housing is made from a first aluminum alloy, and the pedestal is made from a second aluminum alloy different than the first aluminum alloy; or
the pedestal is made of beryllium copper, and the housing is made of an aluminum alloy; or
the pedestal is made of copper, and the housing is made of an aluminum alloy.

13. The thermal management and electromagnetic interference mitigation assembly of claim 1, wherein the housing comprises an electromagnetic interference shield.

14. The thermal management and electromagnetic interference mitigation assembly of claim 13, wherein the electromagnetic interference shield comprises:
a one-piece board level shield defining the housing; or
a multi-piece board level shield including a frame and the housing, which is releasably attachable to and detachable from the frame.

15. The thermal management and electromagnetic interference mitigation assembly of claim 13, wherein:
the housing includes an upper portion defining the inner surface and one or more sidewalls depending from the upper portion; and
the one or more sidewalls are configured for installation to a substrate about a heat source on the substrate;
whereby when the one or more sidewalls are installed to the substrate and the heat source is within an interior cooperatively defined by the housing and the substrate:
the housing is operable for providing electromagnetic interference shielding for the heat source; and
the pedestal extends downwardly towards the heat source such that the thermal interface material is in thermal contact with the heat source and the pedestal to thereby establish a thermally-conductive pathway from the heat source to the pedestal along which heat from the heat source is transferrable to the pedestal.

16. The thermal management and electromagnetic interference mitigation assembly of claim 15, wherein the upper portion and the one or more sidewalls are integrally formed from a same piece of material via stamping and/or drawing.

17. A device comprising a heat source on a substrate and the thermal management and electromagnetic interference mitigation assembly of claim 1, wherein the housing is positioned over the heat source such that:
the housing is operable for providing electromagnetic interference shielding for the heat source;
the pedestal extends downwardly from the inner surface of the housing towards the heat source; and
the thermal interface material is in thermal contact with the heat source and the pedestal to thereby establish a thermally-conductive pathway from the heat source to the pedestal along which heat from the heat source is transferrable to the pedestal.

18. The device of claim 17, wherein:
the substrate comprises a printed circuit board;
the heat source comprises an integrated circuit on the printed circuit board; and
the device further comprises a heat sink thermally coupled to an outer surface of the housing, whereby heat is transferrable along the thermally-conductive pathway established by the thermal interface material from the integrated circuit to the pedestal, from the pedestal to the housing, and from the housing to the heat sink.

19. A method relating to a thermal management and electromagnetic interference mitigation assembly including a housing and a pedestal, the method comprising:
mechanically coupling the pedestal to an inner surface of the housing such that the pedestal extends downwardly relative to the inner surface; and
providing a thermal interface material along a bottom of the pedestal;
wherein:
the thermal management and electromagnetic interference mitigation assembly further comprises one or more laser welds mechanically coupling the pedestal to the inner surface of the housing; and/or
the pedestal includes one or more resilient spring fingers.

20. The method of claim 19, wherein the method includes stamping or drawing one or more portions of the housing, and stamping or drawing one or more portions of the pedestal; and wherein mechanically coupling the pedestal to the inner surface of the housing comprises:
welding the pedestal to the inner surface of the housing; or
using a thermally-conductive adhesive to adhere the pedestal to the inner surface of the housing.

* * * * *